United States Patent [19]
Reay

[11] Patent Number: 5,612,698
[45] Date of Patent: Mar. 18, 1997

[54] CURRENT-INPUT, AUTOSCALING, DUAL-SLOPE ANALOG-TO-DIGITAL CONVERTER

[75] Inventor: Richard J. Reay, Palo Alto, Calif.

[73] Assignee: The Board of Trustees of the Leland Stanford Junior University, Palo Alto, Calif.

[21] Appl. No.: 375,378

[22] Filed: Jan. 17, 1995

[51] Int. Cl.$^6$ .................................................. H03M 1/50
[52] U.S. Cl. ............................................ 341/167; 341/155
[58] Field of Search ...................................... 341/155, 167, 341/166, 168, 169

[56] References Cited

U.S. PATENT DOCUMENTS 4,107,667  8/1978  Kronlage .................................. 341/167

Primary Examiner—Brian K. Young
Attorney, Agent, or Firm—Majestic, Parsons, Siebert & Hsue

[57] ABSTRACT

A current-input, autoscaling, dual-slope A/D converter includes means for adjusting the integration period of the input current to effectively adjust a scale factor associated with the converter. An integrator circuit of the converter includes means for precharging an integration capacitor of the integrator circuit to an off-set voltage associated with an amplifier of the integrator circuit, so as to effectively eliminate integration error due to the off-set voltage. A PMOS switching transistor associated with precharging the integration capacitor is formed in an n-well biased to a voltage approximately equal in magnitude to a voltage held across the integration capacitor, so as to minimized leakage current from the capacitor through the PMOS switching transistor.

7 Claims, 6 Drawing Sheets

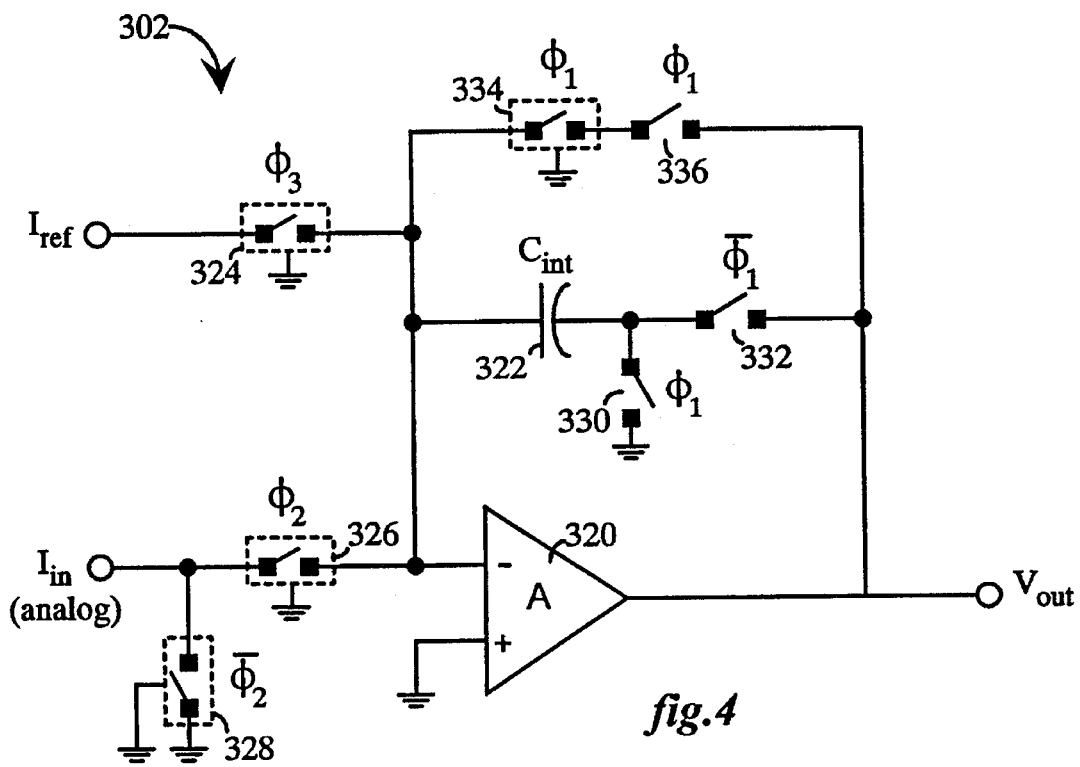
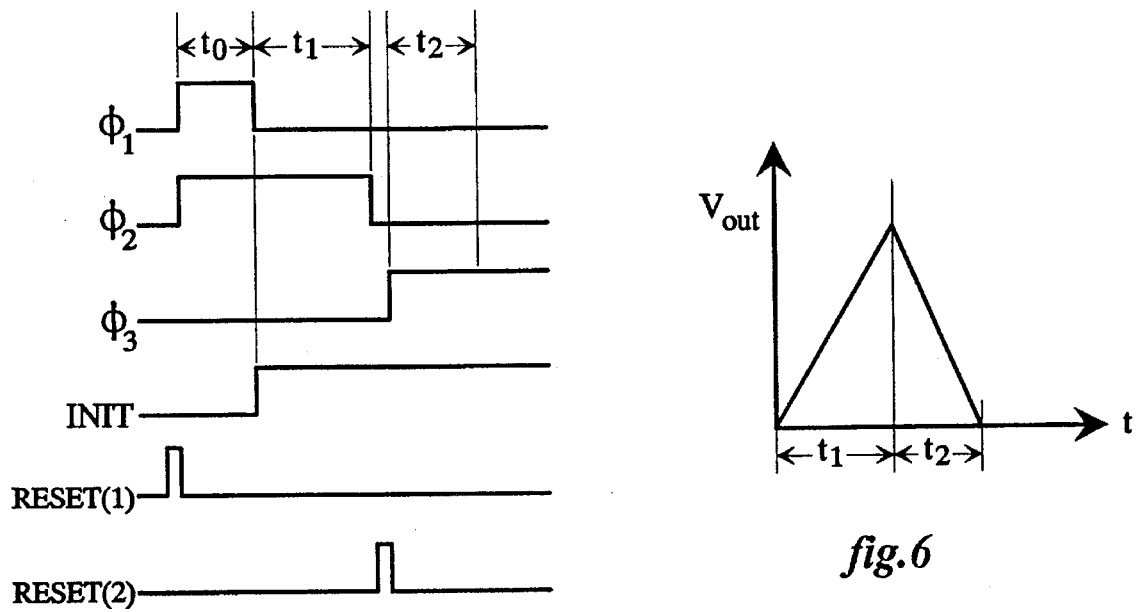
fig.4
fig.5
fig.6

CURRENT-INPUT, AUTOSCALING, DUAL-SLOPE ANALOG-TO-DIGITAL CONVERTER

BACKGROUND OF THE INVENTION

This invention relates in general to analog-to-digital converters and in particular, to current-input, autoscaling, dual-slope analog-to-digital converters ("A/D converters").

In certain applications, it is desirable for A/D converters to measure inputs over as wide a range as possible. For example, in potentiostat applications such as anodic stripping voltammetry and square wave voltammetry analyses with microelectrodes, currents to be measured can range from the picoampere level to over 10 μA.

FIG. 1 illustrates, as an example, a block diagram of a conventional voltage-input, autoscaling A/D converter 3 commonly used to measure a process parameter over a wide input voltage range. The autoscaling A/D converter 3 employs a scaling function by using a programmable gain, front end amplifier 5 to scale the input voltage $V_{in}$ to a fixed binary range (e.g., "full-scale") of an A/D converter circuit 7. This results in a floating-point style conversion, where the A/D converter circuit 7 determines the mantissa and the gain setting of the front end amplifier 5 determines the exponent. A controller 9 sets the gain setting of the programmable gain amplifier 5 such that the gain setting is increased for small digital outputs relative to the fixed binary range of the A/D converter circuit 7, and reduced for large digital outputs relative to the fixed binary range of the A/D converter circuit 7.

The front end or programmable gain amplifier 5 is conventionally implemented using a network of resistors (not shown) that can be individually selected to obtain a desired gain setting. To minimize linearity errors at the points where the gain setting changes, the resistors are conventionally either precisely matched discrete resistors, or on-chip laser-trimmed resistors. Both types of resistors significantly add to the cost associated with such autoscaling A/D converters.

OBJECTS AND SUMMARY OF THE INVENTION

Accordingly, one object of the present invention is an autoscaling, dual-slope A/D converter which does not require expensive, matched discrete or on-chip laser-trimmed resistors.

This and additional objects are accomplished by the various aspects of the present invention, wherein briefly stated, one aspect of the present invention accomplishes one or more of these objects by a current-input, autoscaling, dual-slope A/D converter circuit which scales the dual-slope A/D conversion by adjusting the duration of integration of the input current $I_{in}$, rather than adjusting the magnitude of the input current $I_{in}$ as in conventional dual-slope A/D converters. Included in the A/D converter circuit are an integrator circuit; a first switching means responsive to a second signal $\phi_2$ for passing an input current $I_{in}$ to the integrator circuit input during a period of a pulse on the second signal $\phi_2$; a second switching means for passing a reference current $I_{ref}$ having an opposite polarity than the input current $I_{in}$ to the integrator circuit input in response to a third signal $\phi_3$ activated after the pulse on the second signal $\phi_2$; a pulse generating means receiving a scale factor value for generating the pulse on the second signal $\phi_2$ such that the width of the pulse is related to the scale factor value; a means receiving the output of the integrator circuit for generating a digital number corresponding to the magnitude of the current input $I_{in}$; and a controller means receiving the digital number corresponding to the magnitude of the current input $I_{in}$ for generating the scale factor value such that the scale factor value is inversely related to the digital number.

In another aspect of the present invention, an integrator circuit of the current-input, autoscaling, dual-slope A/D converter circuit compensates for an amplifier offset voltage $V_{os}$ of an amplifier circuit in the integrator circuit by precharging an integration capacitor connected to the amplifier circuit so as to perform an integration function, to a voltage equal in magnitude to the amplifier offset voltage $V_{os}$. Included in the integrator circuit is the amplifier circuit having a first input, a second input, and an output, wherein the amplifier circuit has the offset voltage characteristic $V_{os}$, and the second input of the amplifier circuit is connected to ground; the integration capacitor having first and second ends, wherein the first end of the integration capacitor and the first input of the amplifier circuit are connected to a common node receiving the input current $I_{in}$ passed by the first switching means, and the reference current $I_{ref}$ passed by the second switching means; and third switching means responsive to a first signal $\phi_1$ for precharging, in conjunction with the first switching means, the integration capacitor to a voltage equal in magnitude to the offset voltage characteristic of the amplifier circuit, and connecting the output of the amplifier circuit to the second end of the integration capacitor to form an integrator circuit after precharging the capacitor to the voltage equal in magnitude to the offset voltage characteristic of the amplifier circuit.

In still another aspect of the present invention, the current-input, autoscaling, dual-slope A/D converter circuit is formed as part of an integrated circuit on a p type substrate, and the first switching means of the current-input, autoscaling, dual-slope A/D converter circuit includes a first p-mos transistor for passing the input current to the first end of the integration capacitor. Included in the first p-mos transistor is a p+ source region receiving the input current, a p+ drain region connected to the first end of the integration capacitor, and a gate electrode responsive to the second signal $\phi_2$, wherein the p type substrate is biased to a lowest reference voltage being used by the integrated circuit, the p+ source and p+ drain regions of the first p-mos transistor are formed in an n-well formed in the p type substrate, and the n-well is biased to a voltage approximately equal to a precharged voltage on the integration capacitor so that leakage through the first p-mos transistor of the precharged voltage on the integration capacitor is minimized.

Another aspect of the present invention is a method of converting the magnitude of an input current to a binary number limited by a full-scale number, and automatically adjusting a scale factor associated with the conversion, comprising: passing the input current to an integrator circuit during a pulse on a signal, wherein the pulse width of the pulse is related to the scale factor; passing a reference current having an opposite polarity than the input current to the integrator circuit after the pulse on the signal; generating the binary number from an output of the integrator circuit; and adjusting the scale factor in a manner such that the adjustment is related to the ratio of the binary number and the full-scale number.

Additional objects, features and advantages of the various aspects of the present invention will become apparent from the following description of its preferred embodiments, which description should be taken in conjunction with the accompanying drawings.

BRIEF DESCRIPTION OF THE DRAWINGS

FIG. 4 illustrates, as an example, a circuit schematic for an integrator circuit of a current-input, autoscaling, dual-slope A/D converter, utilizing aspects of the present invention;

FIG. 5 illustrates, as examples, timing diagrams for certain control signals used in the current-input, autoscaling, dual-slope A/D converter circuit of FIG. 3;

FIG. 6 illustrates, as an example, the output voltage $V_{out}$ of the integrator circuit of FIG. 4 in response to control signals depicted in FIG. 5;

DESCRIPTION OF THE PREFERRED EMBODIMENT OF THE INVENTION

In electrochemical analysis, samples are often analyzed with the use of a potentiostat. A potentiostat is an electronic circuit that controls an electrochemical system by maintaining a given voltage between a solution, and a working electrode where chemical reactions occur. The current passing through the working electrode is generally measured and plotted versus applied potential or versus time to give an electrochemical description of the system.

In order to measure the potential between the working electrode and the solution, a second electrode called the reference electrode is used. The working electrode to solution voltage is then given by:

$$V_{work/sol} = V_{work/ref} + V_{ref/sol} \quad (1)$$

The reference electrode material is chosen so that $V_{ref/sol}$ will be a constant value and thus $V_{work/sol}$ can be found by measuring $V_{work/ref}$, which is simply the voltage between two conductors.

The current for the chemical reaction is usually supplied by a third electrode, called a counter electrode. The current is not directly supplied by the reference electrode, because $V_{ref/sol}$ is a function of the current passing through the electrode. Therefore, any current flowing through the reference electrode will change the voltage across it, which was assumed to be constant, causing an error in the value of $V_{work/sol}$ calculated in equation (1). The three electrode cell is analogous to the Kelvin voltage measurement approach, where one wire is used to source current and a second wire is used to sense the voltage.

Figure 2:
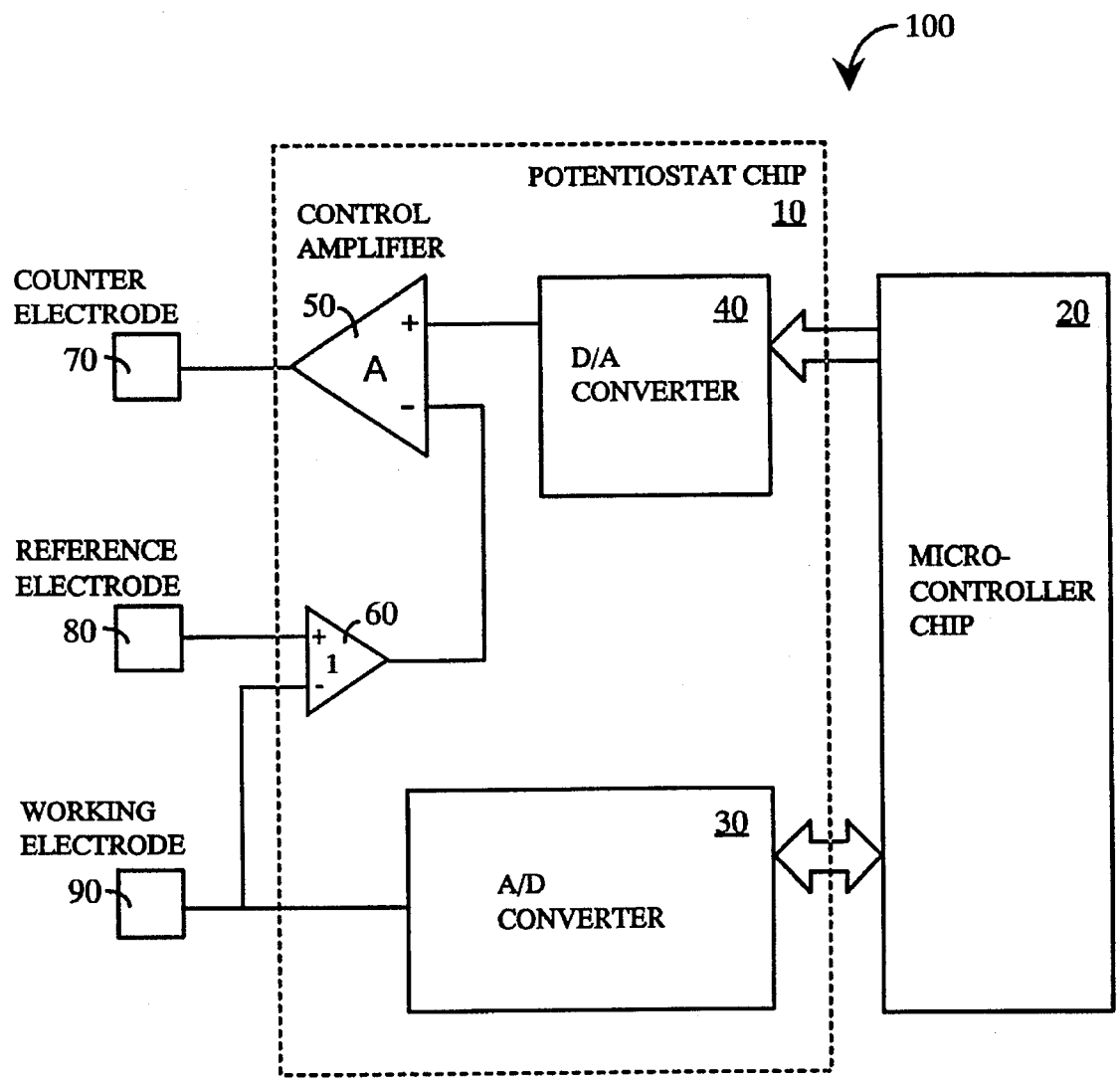
FIG. 2 illustrates, as an example, a potentiostat circuit including a current-input, autoscaling, dual-slope A/D converter, utilizing aspects of the present invention.

FIG. 2 illustrates, as an example, a potentiostat circuit 100 including a micro-controller chip 20 and a potentiostat chip 10, wherein the potentiostat chip 10 is adapted to connect to the micro-controller chip 20, a counter electrode 70, a reference electrode 80, and a working electrode 90. The potentiostat chip 10 is preferably a CMOS integrated circuit including a D/A converter 40, a control amplifier 50, a feedback amplifier 60, and a current-input, autoscaling, dual-slope A/D converter 30. The D/A converter 40 sets the cell voltage, which is usually varied with time. The control amplifier 50 is used in a feedback loop to supply current to the counter electrode 70 and regulate the voltage at the reference electrode 80. The current-input, autoscaling, dual-slope A/D converter 30 measures the current flowing through the cell and also holds the working electrode 90 at a virtual ground relative to the circuit ground.

In general, the A/D converter in a potentiostat must measure currents over as wide a range as possible, and for a low-cost solution, an array of external, matched discrete components should be avoided. For anodic stripping voltammetry and square wave voltammetry analyses with microelectrodes, currents can range from the picoampere level to over 10 µA. In certain high speed voltammetry experiments the conversion rate should be as high as possible, but for many applications such as heavy metal analysis, conversion rates of a few hundred Hertz are acceptable.

A commercial microcontroller chip 20 is used to generate the signals sent to the D/A converter 40 and records the output of the current-input, autoscaling, dual-slope A/D converter 30. Counters (e.g., 340 in FIG. 7 and 350 in FIG. 8) for controlling the integration time of the converters are also preferably implemented by the microcontroller 20. This minimizes the on-chip digital circuitry, reducing substrate-coupled noise in the sensitive analog blocks.

Figure 3:
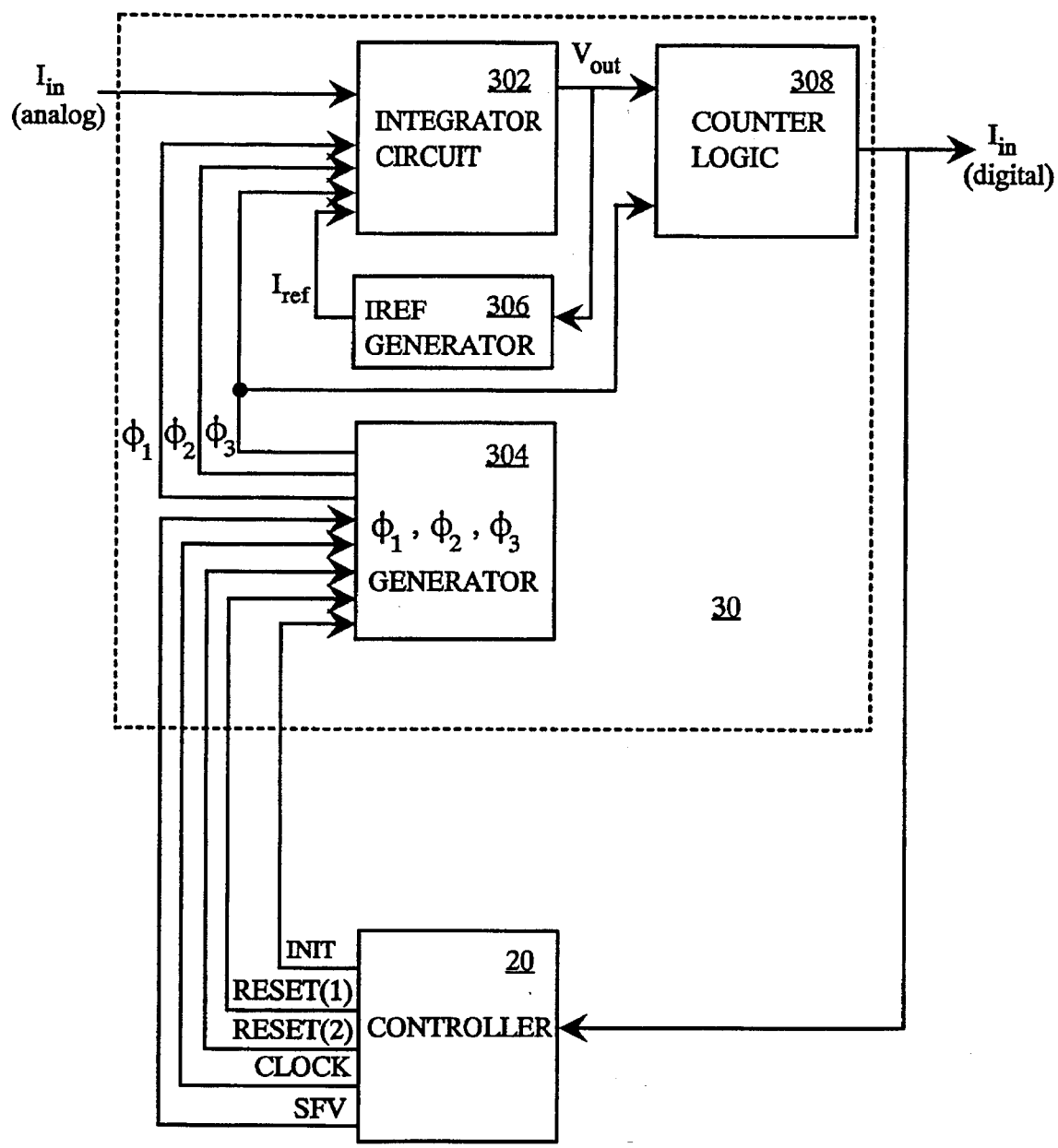
FIG. 3 illustrates, as an example, a block diagram of a current-input, autoscaling, dual-slope A/D converter utilizing aspects of the present invention.

FIG. 3 illustrates, as an example, a block diagram of the current-input, autoscaling dual-slope A/D converter 30 of FIG. 2. Included in the A/D converter 30 is an integrator circuit 302, a $I_{ref}$ generator circuit 306, a $\phi_1$, $\phi_2$, $\phi_3$ signal generator circuit 304, and a counter logic circuit 308. The integrator circuit 302 receives an input current $I_{in}$ from, for example, the working electrode 90 of FIG. 2, a reference current $I_{ref}$ from the $I_{ref}$ generator circuit 306, and certain control signals $\phi_1$, $\phi_2$, and $\phi_3$ from the $\phi_1$, $\phi_2$, $\phi_3$ signal generator circuit 304, and generates in response thereof, an output voltage $V_{out}$. The $I_{ref}$ generator circuit 306 generates the reference current $I_{ref}$ in a conventional manner from the output voltage $V_{out}$ of the integrator circuit 302. The counter logic circuit 308 generates a digital number, $I_{in}$ (digital), corresponding to the input current, $I_{in}$ (analog), provided to the integrator circuit 302. The $\phi_1$, $\phi_2$, $\phi_3$ signal generator circuit 304 generates the control signals $\phi_1$, $\phi_2$, and $\phi_3$ in response to certain signals received from the micro-controller chip 20. Although shown as distinct blocks in FIG. 3, certain digital portions, such as, for example, counters, of the counter logic 308 and $\phi_1$, $\phi_2$, $\phi_3$ signal generator circuit 304 are preferably performed by the micro-controller chip 20.

Figure 1:
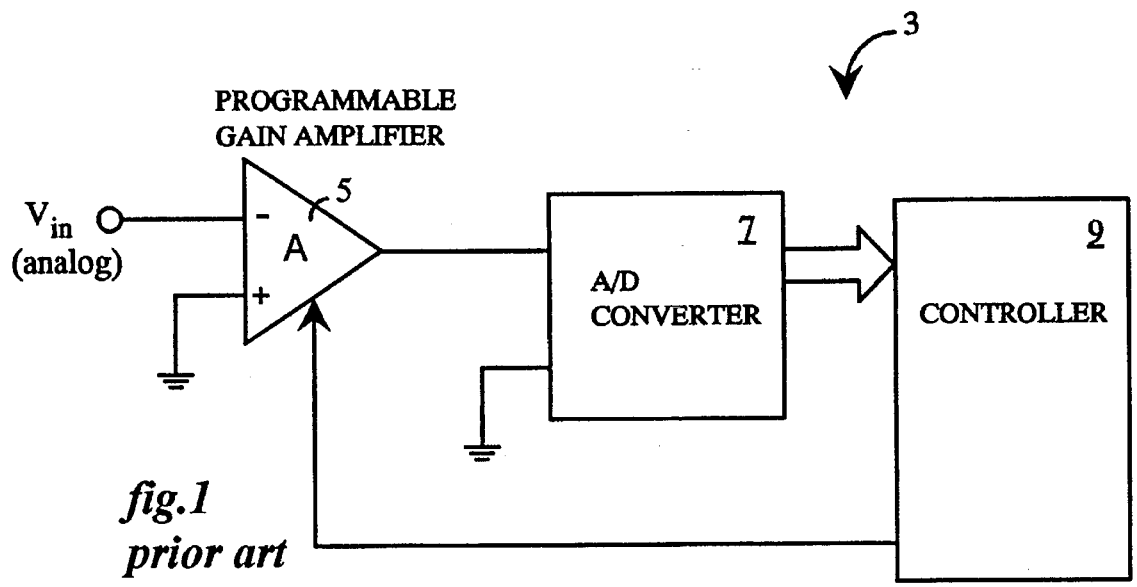
FIG. 1 illustrates, as an example, a block diagram of a conventional, voltage-input autoscaling A/D converter.
Figure 11:
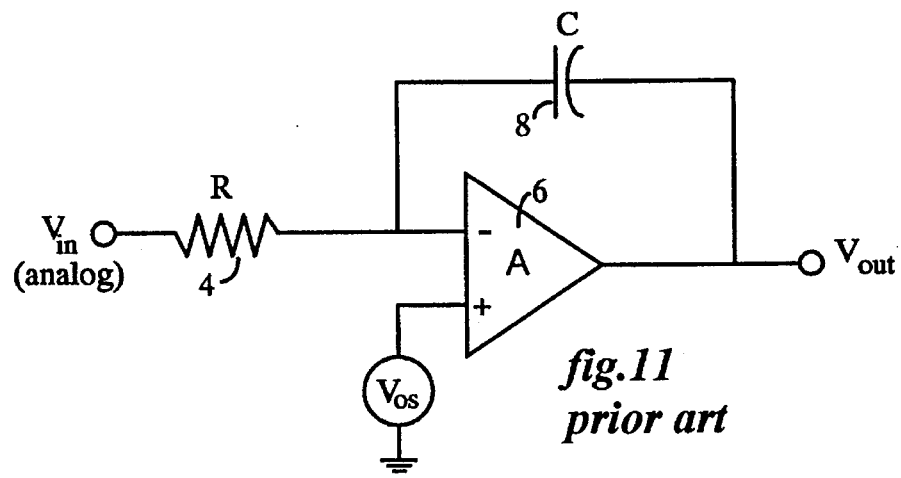
FIG. 11 illustrates a circuit schematic of a conventional voltage-input integrator circuit for a dual-slope A/D converter.

FIG. 4 illustrates, as an example, a circuit schematic for the integrator circuit 302 of the current-input, autoscaling, dual-slope A/D converter 30. A current-input A/D converter structure was selected over the conventional voltage-input A/D converter structure, because the current-input A/D converter structure not only eliminates the requirement of input resistors, but also facilitates more accurate results. For example, FIG. 11 illustrates an integrator portion of a conventional voltage-input, dual-slope A/D converter circuit. For this circuit, the integrator output voltage $V_{out}$ is given by:

$$V_{out} = V_{os} - \frac{1}{RC} \int (V_{in} - V_{os}) \, dt \quad (2)$$

where:

$V_{in}$=input voltage to integrator circuit;

$V_{out}$=output voltage of integrator circuit;

$V_{os}$=amplifier offset voltage; and

R,C=resistance of resistor R, capacitance of capacitor C.

As long as $V_{in} \gg V_{os}$, the integrator circuit accurately performs its intended function, which is to provide an output voltage $V_{out}$ substantially equal to the integral of the input voltage $V_{in}$. A problem occurs, however, when the magnitude of the input voltage $V_{in}$ becomes small relative to that of the amplifier offset voltage $V_{os}$. when this condition occurs, a significant error may appear in the integration. In particular, if $V_{in} \ll V_{os}$, then the amplifier offset voltage $V_{os}$ dominates the input voltage $V_{in}$ under the integral, and the output voltage $V_{out}$ becomes substantially equal to the integral of the amplifier offset voltage $V_{os}$, instead of the input voltage $V_{in}$ as desired.

In the current-input integrator circuit of FIG. 4, however, with switches 330, 334 and 336 in their normal operation open state, switch 332 in its normal operation closed state, switches 324 and 328 open, and switch 326 closed, the integrator output voltage is given by:

$$V_{out} = V_{os} - \frac{1}{C} \int I_{in} \, dt \quad (3)$$

where:

$I_{in}$=input current to integrator circuit;

$V_{out}$=output voltage of integrator circuit;

$V_{os}$=amplifier offset voltage; and

C=capacitance of capacitor C.

Since there is no error term in the integral, the input current $I_{in}$ can be accurately integrated down to very small values. There is just a constant offset voltage $V_{os}$ that will be the same no matter how long the input current $I_{in}$ is integrated. Accordingly, unlike the conventional voltage input integrator circuit of FIG. 11, very small input signals can be accurately converted by the current-input integrator circuit of FIG. 4.

In particular, to perform a conversion, the integration capacitor $C_{int}$ 322 is reset during a time interval $t_0$, the input current $I_{in}$ is integrated for a time interval $t_1$ during which time the output voltage $V_{out}$ of the integrator circuit 302 rises from zero to a maximum value, and a reference current $I_{ref}$ of opposite polarity than the input current $I_{in}$ is then integrated until the output voltage $V_{out}$ falls back from the maximum value to zero. The time $t_2$ required for the second integration is proportional to the maximum value of the output voltage $V_{out}$. An example of the output voltage $V_{out}$ waveform is illustrated in FIG. 6.

By controlling the time $t_1$ and measuring $t_2$, the magnitude of the input current $I_{in}$ can be calculated as:

$$I_{in} = \frac{t_2}{t_1} I_{ref} \quad (4)$$

which result is independent of the integrating capacitor, $C_{int}$ 322. The n-bit digital output value is found by counting a reference clock for the duration of time $t_2$ using an n-bit counter. A useful feature of this topology is that by digitally changing the length of the first integration time, $t_1$, the A/D converter input range can be scaled, as is evident in equation (4). The value for $t_1$ can be set by waiting an integral number of reference clock periods, and thus can be controlled with extremely high accuracy over many orders of magnitude. This eliminates the need for external or on-chip matched components since the gain is set digitally. Since the result is independent of the integration capacitor $C_{int}$ 322, only the accuracy and stability of $I_{ref}$ determine the overall converter accuracy.

One drawback of this topology is that the conversion time can be a function of the current input range, since $t_1$ can vary by orders of magnitude. For realistic component values, however, the time allocated for the second integration, $t_{2max}$, is larger than $t_1$ except at the smallest few decades of current range, resulting in a fairly constant total conversion time. In the preferred embodiment, for example, $t_2$ is measured with a 12 bit counter, resulting in 12 bit plus sign resolution, and $t_1$ is set with a 15 bit counter, for a total input range of over eight decades. If a 2 MHz clock is used for the counters, the conversion time is about 2.5 ms for most current ranges. If only 8 bit resolution is needed, an 8 bit counter can be used to measure $t_2$, reducing the conversion time to about 500 µs. To illustrate the effect of the input range on the conversion time, some examples are tabulated below, assuming $C_{int}$=10 pF, fclock=2 MHz, and 12 bit resolution.

| Current Input Range | Current Resolution | Conversion Time |
| --- | --- | --- |
| 409.6 pA | 100 fA | 102.05 ms |
| 4.096 nA | 1 pA | 12.05 ms |
| 40.96 nA | 10 pA | 3.05 ms |
| 409.6 nA | 100 pA | 2.05 ms |
| 4.096 µA | 1 nA | 2.05 ms |
| 40.96 µA | 10 nA | 2.05 ms |

FIG. 5 illustrates, as examples, timing diagrams of certain control signals including $\phi_1$, $\phi_2$ and $\phi_3$ which control operation of the integrator circuit 302 of FIG. 4. The integration capacitor $C_{int}$ 322 is reset during a period $t_0$ of a pulse on control signal $\phi_1$. The input current $I_{in}$ is integrated to generate an increasing output voltage $V_{out}$ as depicted in FIG. 6, during a period $t_1$ initiated by a falling edge of control signal $\phi_1$ while control signal $\phi_2$ is active, and ending with a falling edge of control signal $\phi_2$. The reference current $I_{ref}$ of opposite polarity to the input current $I_{in}$ is then integrated to decrease the output voltage $V_{out}$ generated by integrating the input current $I_{in}$ for the time period $t_1$, during a period $t_2$ initiated by a rising edge of control signal $\phi_3$, and ending when the output voltage $V_{out}$ either becomes zero or changes polarity (i.e., crosses zero).

In the preferred embodiment, the integration capacitor $C_{int}$ 322 is reset by precharging it with a voltage equal in magnitude to the amplifier offset voltage $V_{os}$. Such a precharge on the integration capacitor $C_{int}$ 322 compensates for the amplifier offset voltage $V_{os}$ term in equation (3) and as a result, the output voltage $V_{out}$ substantially starts off at zero instead of $V_{os}$ when integrating the input current $I_{in}$. To precharge the integration capacitor $C_{int}$ 322, a switched capacitor offset compensated amplifier technique is employed. During an offset storage mode (i.e., reset period), $\phi_1$ is HIGH, the output voltage $V_{out}$ is not valid, the input current $I_{in}$ is set to zero, and the voltage $V_{cap}$ stored on the integration capacitor $C_{int}$ 322 is:

$$V_{cap} = \frac{A}{A+1} V_{os} \quad (5)$$

where:

Vos=amplifier offset voltage; and

A=gain of amplifier 320. As a result, during an evaluation mode (i.e., conversion period) when $\phi_1$ is LOW, the error term due to $V_{os}$ can be shown to be negligible since A>>1.

For this type of offset cancellation to be effective, the charge injection due to switches in the circuit turning off, for example, should be reduced. A number of well known methods for doing this include differential operation, see, e.g., P. R. Gray et. al., "Some practical aspects of switched-capacitor filter design," in 1981 *ISCAS Proc.*, pp. 419–422, April 1981, offset storage at a desensitized input, see, e.g., M. Degrauwe et. al., "A Micropower CMOS-Instrumentation Amplifier," *IEEE Journal of Solid-State Circuits*, vol. 20, no. 3, pp. 805–807, June 1985, and the use of dummy switches, see, e.g., L. A. Bienstman et. al., "An 8-channel 8*b* µP compatible NMOS converter with programmable ranges," in *ISSCC Dig. Tech. Papers*, Feb. 1980.

In the preferred embodiment, to cancel the offset voltage due to charge injection of the switches in FIG. 4, a conversion is done with the input current $I_{in}$ equal to zero, and the resulting output voltage $V_{out}$ is stored and digitally subtracted from subsequent results. A second switch 334 is added in series with the feedback switch 336, wherein the second switch 334 is in a grounded n-well to avoid forward biasing the source diffusion of the feedback switch 336 when it is off. The advantage of this topology is that the non-inverting input stays at a constant voltage equal to $V_{os}$ of the amplifier 320, and thus the effects of large parasitic capacitance $C_s$ values are minimized.

Figure 7:
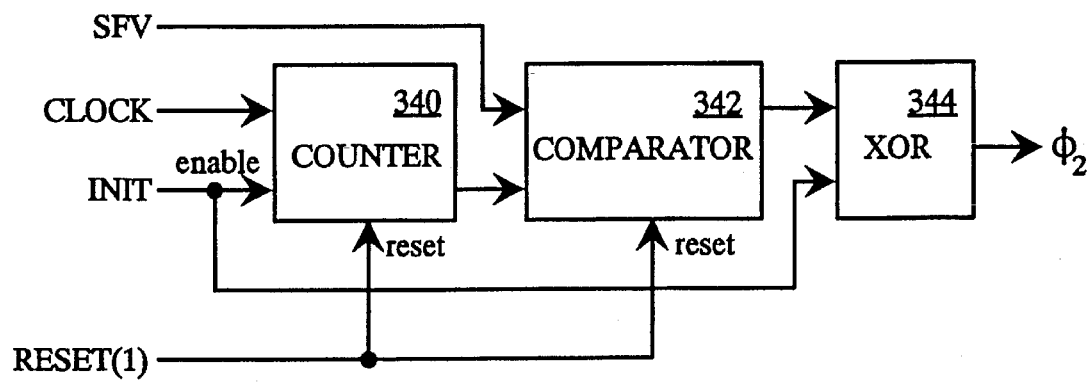
FIG. 7 illustrates, as an example, a block diagram of a programmable pulse width generator of a current-input, autoscaling, dual-slope A/D converter, utilizing aspects of the present invention, for generating the control signal $\phi_2$.

FIG. 7 illustrates, as an example, a block diagram of a programmable pulse width generator for generating the control signal $\phi_2$, as part of the $\phi_1$, $\phi_2$, $\phi_3$ generator 304. The micro-controller chip 20 preferably provides a clock signal CLOCK, control signals RESET(1) and INIT, and a scale factor value SFV to the programmable pulse width generator. Activation of the reset signal RESET(1) causes the control signal $\phi_2$ to be activated, and activation of the conversion initiating signal INIT initiates a conversion of the input current $I_{int}$ by the current-input, autoscaling, dual-slope A/D converter 30. Relative timing diagrams for the reset signal RESET(1) and conversion initiating signal INIT are depicted in FIG. 5, along with control signals $\phi_1$, $\phi_2$, and $\phi_3$.

Included in the programmable pulse width generator are a counter 340, a comparator 342, and an exclusive-OR ("XOR") logic circuit 344. The reset signal RESET(1) is connected to respective reset inputs of the counter 340 and the comparator 342 so that activation of the reset signal RESET(1) causes the outputs of the counter 340 and the comparator 342 to be reset to zero. The clock signal CLOCK is connected to a clock input of the counter 340, and the conversion initiating signal INIT is connected to an enable input of the counter 340, so that activation of the conversion initiating signal INIT causes the counter 340 to start to count up at a rate determined by the clock signal CLOCK. The comparator 342 compares the output of the counter 340 received at a first input of the comparator 342, against the scale factor value SFV received at a second input of the comparator 342. When the output of the counter 340 reaches or exceeds the scale factor value SFV, the output of the comparator 342 changes from its reset state, for example, LOW, to another state, for example, HIGH. The exclusive-OR logic circuit 344 receives at a first input, the conversion initiating signal INIT, and at a second input, the output of the comparator 342. Thus, while the conversion initiating signal INIT is activated HIGH, the output $\phi_2$ of the exclusive-OR logic circuit 344 is HIGH when the output of the comparator is reset to a LOW logic state by the reset signal RESET(1), and the output $\phi_2$ of the exclusive-OR logic circuit 344 is LOW when the output of the comparator changes to a HIGH logic state when the output of the counter 340 reaches or exceeds the scale factor value SFV. Accordingly, the magnitude of the scale factor value SFV determines the width of the pulse on the control signal $\phi_2$. The larger the value of the scale factor value SFV, the longer the counter 340 counts before the comparator 342 changes its output state causing the control signal $\phi_2$ to fall to a LOW logic state.

Figure 8:
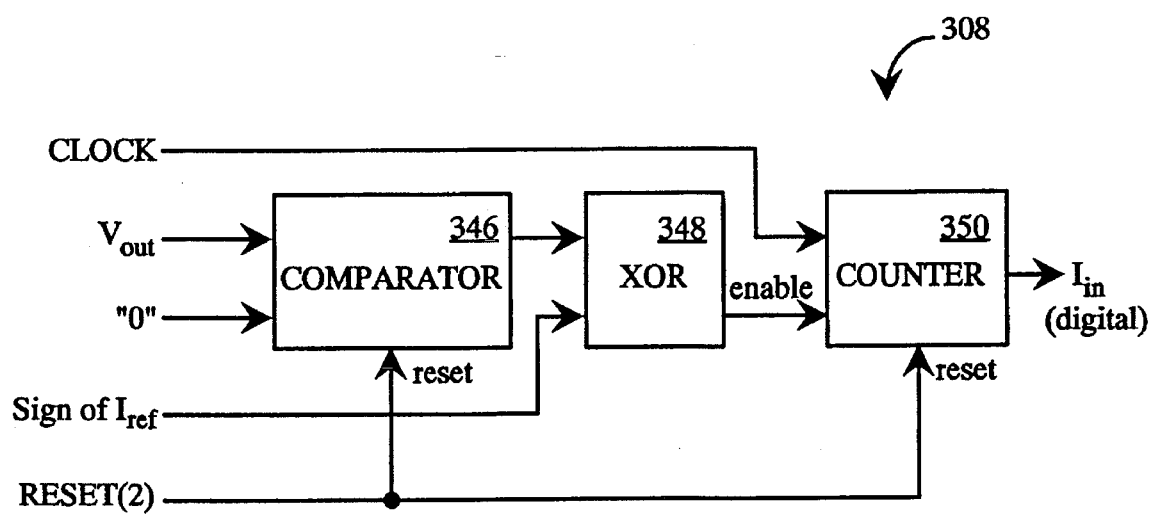
FIG. 8 illustrates, as an example, a block diagram of a counter logic circuit of a current-input, autoscaling, dual-slope A/D converter, utilizing aspects of the present invention, for generating a binary number from the output voltage $V_{out}$ of the integrator circuit of FIG. 4.

FIG. 8 illustrates, as an example, a block diagram of the counter logic circuit 308 which generates, from the output voltage $V_{out}$ of the integrator circuit 302, a binary number $I_{in}$ (digital) corresponding to the input current $I_{in}$ (analog). The micro-controller chip 20 preferably provides along with the clock signal CLOCK, a second reset signal RESET(2) to the counter logic circuit 308. Activation of the reset signal RESET(2) preferably causes, after an appropriate delay, the control signal $\phi_1$ to be activated by the $\phi_1$, $\phi_2$, $\phi_3$ generator 304. Relative timing diagrams for the second reset signal RESET(2) and control signals $\phi_1$, $\phi_2$, and $\phi_3$ are depicted, for examples, in FIG. 5.

Included in the counter logic circuit 308 are a comparator 346, an exclusive-OR ("XOR") logic circuit 348, and a counter 350. The reset signal RESET(2) is connected to respective reset inputs of the comparator 346 and the counter 350 so that activation of the second reset signal RESET(2) causes the outputs of the comparator 346 and the counter 350 to be respectively reset to LOW and zero. The comparator 346 compares the voltage output $V_{out}$ of the integrator circuit 302 received at a first input of the comparator 346, against a "0" (zero) value received at a second input of the comparator 346. When the voltage output $V_{out}$ of the integrator circuit 302 is less than or equal to "0", the output of the comparator 346 is in a LOW logic state. Conversely, when the voltage output $V_{out}$ of the integrator circuit 302 is greater than "0", the output of the comparator 346 is in a HIGH logic state. The XOR logic circuit 348 receives at a first input, the output of the comparator 342, and at a second input, a logic state indicative of the sign of the reference current $I_{ref}$. In particular, when $I_{ref}$ is a positive current, the XOR logic circuit 348 receives at its second input, a HIGH logic state, and when $I_{ref}$ is a negative current, the XOR logic circuit 348 receives at its second input, a LOW logic state. The counter 350 receives at a clock input, the clock signal CLOCK, and at an enable input, the output of the XOR logic circuit 348. Thus, if the sign of $I_{ref}$ is negative and $V_{out}$ is greater than "0" in a first case, or if the sign of is positive and $V_{out}$ is less than or equal to "0" in a second case, the output of the XOR logic circuit 348 goes HIGH, enabling the counter 350. The counter thereupon starts to count up at a rate determined by the clock signal CLOCK until its enable input goes LOW causing it to stop and hold its last count. This occurs when the output voltage $V_{out}$ of the integrator circuit 302 becomes less than or equal to "0" in the first case, or when the output voltage $V_{out}$ of the integrator circuit 302 becomes greater than "0" in the second case.

In many electrochemical systems, a potentiostat updates the control voltage at less than a few hundred Hz. The infrequent update rate poses a difficulty for switched capacitor, offset compensated circuits such as the integrator circuit 302. Since the offset storage capacitors are fairly small (typically under 5 pF), leakage currents will drain charge from these capacitors, and over time, cause significant voltage errors. For infrequent yet accurate offset compensation, the leakage currents at the storage capacitors must be minimized.

Leakage current at an on-chip storage capacitor has four major components: leakage through the capacitor's dielectric, surface leakage currents, gate current for the following amplifier transistor, and junction leakage current from the switch accessing the capacitor. In a stable, moderate quality CMOS process, the first three leakage terms will be very small, and the fourth term will dominate, see, e.g., R. Gregorian et. al., *Analog MOS Integrated Circuits for Signal Processing,* New York: John Wiley & Sons, 1986.

In its preferred embodiment, the potentiostat chip 10 is designed in an n-well process and uses ±5 V power supplies, so the p-substrate is biased at $V_{ss}$. The MOS access switch for the hold capacitor has two diffusions, one connected to the input signal and one connected to the capacitor. When the switch turns off, $V_{in}$ is stored at the capacitor node. There is a parasitic diode formed by the switch diffusion and the substrate, that is reverse biased with a voltage $V_{cap}-V_{ss}$. This bias is typically 5 V, so leakage currents on the order of a picoampere can discharge the capacitor, causing a voltage droop on the order of volts per second. For a hold time of 10 ms, this would cause an error of tens of millivolts or more.

Figure 9:
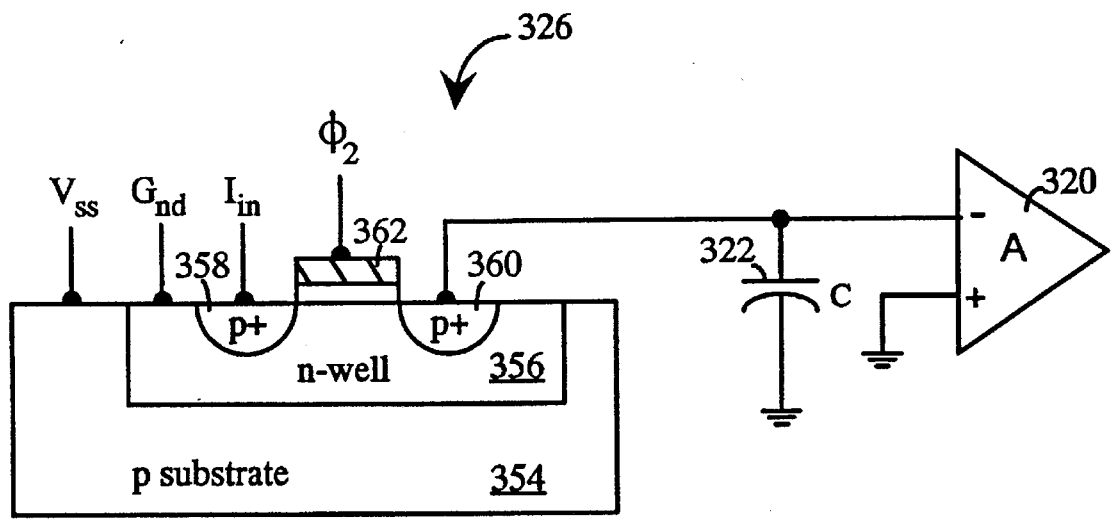
FIG. 9 illustrates, as an example, a partial cross-sectional view of a p-mos switching transistor, utilizing aspects of the present invention, which is fabricated in an integrated circuit including the current-input, autoscaling dual-slope A/D converter of FIG. 3, wherein the p-mos switching transistor is preferably used in the integrator circuit of FIG. 4.

FIG. 9 illustrates a design for transistor switch 326, for example, that reduces the droop error. Similar structures for transistor switches 324 and 334 are also contemplated using the approach described herein. In particular, if all of the critical storage nodes are virtual grounds, and thus very close to ground, then the access switch can be realized with a PMOS transistor in a grounded n-well (still assuming ±5 V power supplies). Since the stored value is within a few millivolts of ground and the substrate below the switch is grounded, the bias across the diode is only a few millivolts. This will reduce the leakage currents by orders of magnitude, since the leakage current in a MOS diffusion is roughly proportional to the reverse bias, see, e.g., *HSPICE User's Manual,* vol. 2, Campbell, Calif.: Meta Software, p. 6–37.

In a general case, to reduce leakage currents in such sample-and-hold circuits, the switching transistor is formed in a well which is biased to the same potential as the held signal. In the particular case of the integrator circuit 302 of FIG. 4, all of the sample and hold nodes are virtual ground amplifier inputs and the stored voltage $V_{cap}$ is very close to ground. Thus, the n-well 356 of switching transistor 326 is biased to ground to minimize the leakage.

Figure 10:
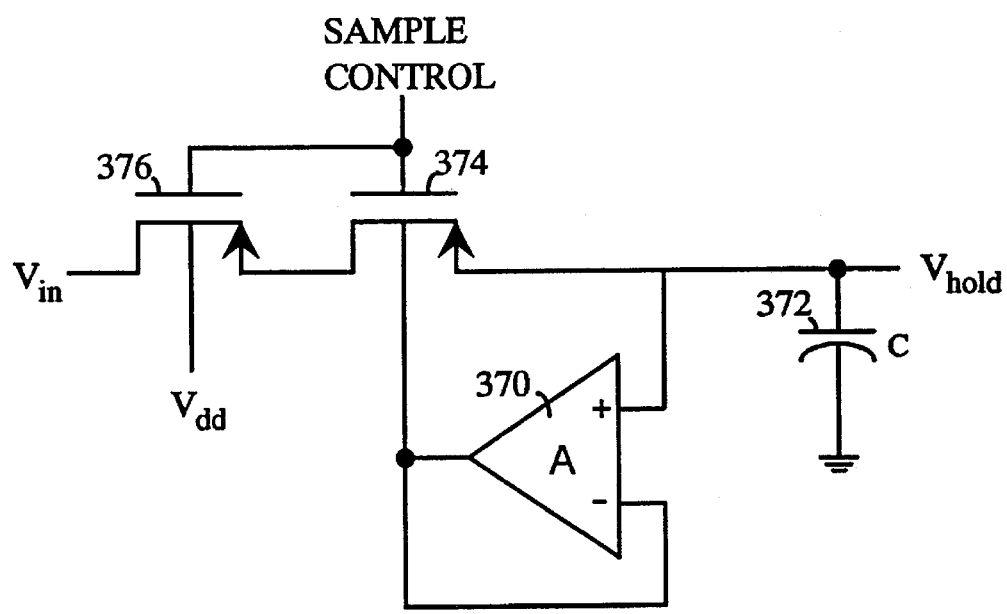
FIG. 10 illustrates, as an example, a circuit schematic for a switching transistor pair useful for minimizing leakage current from a capacitor connected to the pair in a sample-and-hold circuit utilizing aspects of the present invention.

FIG. 10, illustrates, as an example, a circuit for reducing leakage current in a sample-and-hold circuit for the general case of an arbitrary input voltage. In this case, the well is preferably biased to $V_{dd}$ which is approximately equal to the held voltage $V_{hold}$ (e.g., the voltage held across capacitor C). A PMOS transistor 376 is added to avoid forward biasing the drain of the sample switch, PMOS transistor 374, when the sample switch is off and $V_{in}$ is greater than $V_{hold}$.

Although the various aspects of the present invention have been described with respect to a preferred embodiment, it will be understood that the invention is entitled to full protection within the full scope of the appended claims.

What is claimed is:

1. An autoscaling analog-to-digital converter circuit comprising:

an integrator circuit having an input and an output;

first switching means responsive to a second signal for passing an input current to said integrator circuit input during a period of a pulse on said second signal;

second switching means for passing a reference current having an opposite polarity than said input current to said integrator circuit input in response to a third signal activated after said pulse on said second signal;

pulse generating means for receiving a scale factor value, and generating said pulse on said second signal such that said period of said pulse is related to said scale factor value;

means for receiving said output of said integrator circuit, and generating a digital number corresponding to the magnitude of said current input in response thereof; and controller means for receiving said digital number corresponding to the magnitude of said current input, and generating said scale factor value such that said scale factor value is inversely proportional to said digital number.

2. The autoscaling analog-to-digital converter circuit as recited in claim 1, wherein said pulse generating means comprises:

a first counter circuit having a clock input receiving a clock signal, an enable input receiving an initiating signal which initiates said period of said pulse on said second signal when said initiating signal changes from a first state to a second state, and an output for transmitting a first counter output signal;

a first comparator circuit having a reset input receiving a first reset signal, a first input receiving said first counter output signal, and a second input receiving said scale factor value, and an output for transmitting a first comparator output signal which changes from a first state set by said first reset signal to a second state when said first counter output signal is greater than said scale factor value; and an exclusive-OR logic circuit having a first input receiving said initiating signal, a second input receiving said first comparator output signal, and an output for transmitting said second signal.

3. The autoscaling analog-to-digital converter circuit as recited in claim 1, wherein said digital number generating means comprises:

a second comparator circuit having a reset input receiving a second reset signal, a first input receiving said output of said integrator circuit, a second input receiving a "0" value, and an output for transmitting a second comparator output signal which changes from a first state set by said second reset lo signal to a second state when said output of said integrator circuit is less than or equal to said "0" value;

an XOR logic circuit having a first input receiving said second comparator output signal, a second input receiving a signal indicative of the sign of the reference current, and an output; and a second counter circuit having a clock input receiving said clock signal, a reset input receiving said second reset signal, an enable input receiving said output of said XOR logic circuit, and an output transmitting said digital number corresponding to said analog value.

4. The autoscaling analog-to-digital converter circuit as recited in claim 1, wherein said integrator circuit comprises:

an amplifier circuit having a first input, a second input, and an output, wherein said amplifier circuit has an off-set voltage characteristic, and said second input of said amplifier circuit is connected to ground;

a capacitor having first and second ends, wherein said first end of said capacitor and said first input of said amplifier circuit are connected to a common node receiving said input current passed by said first switching means and said reference current passed by said second switching means; and third switching means responsive to a first signal for precharging, in conjunction with said first switching means, said capacitor to a voltage equal in magnitude to said off-set voltage characteristic of said amplifier circuit, and connecting said output of said amplifier circuit to said second end of said capacitor to form an integrator circuit after precharging said capacitor to said voltage equal in magnitude to said off-set voltage characteristic of said amplifier circuit.

5. The autoscaling analog-to-digital converter circuit as recited in claim 4, wherein said autoscaling analog-to-digital converter circuit is part of an integrated circuit formed on a p type substrate, said first switching means including a first p-mos transistor for passing said input current to said first end of said capacitor, said first p-mos transistor having a p+ source region receiving said input current, a p+ drain region connected to said first end of said capacitor, and a gate electrode responsive to said second signal, wherein said p type substrate is biased to a lowest reference voltage being used by said integrated circuit, said p+ source and p+ drain regions of said first p-mos transistor are formed in an n-well formed in said p type substrate, and said n-well is biased to a voltage approximately equal in magnitude to a precharged voltage on said capacitor so that leakage of said precharged voltage on said capacitor through said first p-mos transistor is minimized.

6. The autoscaling analog-to-digital converter circuit as recited in claim 4, wherein said autoscaling analog-to-digital converter circuit is part of an integrated circuit formed on a p type substrate, said second switching means including a second p-mos transistor for passing said reference current to said first end of said capacitor, said second p-mos transistor having a p+ source region receiving said reference current, a p+ drain region connected to said first end of said capacitor, and a gate electrode responsive to said third signal, wherein said p type substrate is biased to a lowest reference voltage being used by said integrated circuit, said p+ source and p+ drain regions of said second p-mos transistor are formed in an n-well formed in said p type substrate, and said n-well is biased to a voltage approximately equal to a precharged voltage on said capacitor so that leakage of said precharged voltage on said capacitor through said second p-mos transistor is minimized.

7. The autoscaling analog-to-digital converter circuit as recited in claim 4, wherein said autoscaling analog-to-digital converter circuit is part of an integrated circuit formed on a p type substrate, said third switching means including a third p-mos transistor for passing said input current to said first end of said capacitor, said third p-mos transistor having a p+ source region connected to said output of said integrator circuit, a p+ drain region connected to said first end of said capacitor, and a gate electrode responsive to said first signal, wherein said p type substrate is biased to a lowest reference voltage being used by said integrated circuit, said p+ source and p+ drain regions of said p-mos transistor are formed in an n-well formed in said p type substrate, and said n-well is biased to a voltage approximately equal in magnitude to a precharged voltage on said capacitor so that leakage of said precharged voltage on said capacitor through said third p-mos transistor is minimized.

* * * * *

UNITED STATES PATENT AND TRADEMARK OFFICE
CERTIFICATE OF CORRECTION

PATENT NO. : 5,612,698
DATED : March 18, 1997
INVENTOR(S) : Richard J. Reay

It is certified that error appears in the above-indentified patent and that said Letters Patent is hereby corrected as shown below:

In Column 10, line 56, Claim 3:
  replace "set by said second reset lo signal to a second state when" with:

--set by said second reset signal to a second state when--

Signed and Sealed this

Twenty-seventh Day of January, 1998

Attest:

BRUCE LEHMAN

Attesting Officer

Commissioner of Patents and Trademarks